United States Patent [19]

Gordon

[11] 4,207,611
[45] Jun. 10, 1980

[54] APPARATUS AND METHOD FOR CALIBRATED TESTING OF A VEHICLE ELECTRICAL SYSTEM

[75] Inventor: Thomas C. Gordon, Dearborn Heights, Mich.

[73] Assignee: Ford Motor Company, Dearborn, Mich.

[21] Appl. No.: 970,786

[22] Filed: Dec. 18, 1978

[51] Int. Cl.² .................... G01R 31/02; G01R 17/02
[52] U.S. Cl. ................................ 364/580; 364/425; 364/571; 364/483; 324/51; 324/73 R
[58] Field of Search ............ 364/571, 579, 580, 425, 364/483; 324/73 R, 73 AT, 15, 16 R, 51; 73/168, 1 F, 117.3

[56] References Cited

U.S. PATENT DOCUMENTS

| | | | |
|---|---|---|---|
| Re. 22,470 | 4/1944 | Heyer | 175/183 |
| 2,142,860 | 1/1939 | Mildner | 200/149 A |
| 3,424,979 | 1/1969 | Socker | 324/73 R |
| 3,438,019 | 4/1969 | Gowan | 364/900 X |
| 3,513,393 | 5/1970 | Myers | 324/133 |
| 3,546,582 | 12/1970 | Barnard et al. | 324/73 |
| 3,594,642 | 7/1971 | Wright | 324/158 |
| 3,617,870 | 11/1971 | Howes | 324/15 |
| 3,622,877 | 11/1971 | MacDavid | 324/73 R |
| 3,630,076 | 12/1971 | Staudt | 73/117.3 |
| 3,638,108 | 1/1972 | Channing | 324/29.5 |
| 3,646,438 | 2/1972 | Staff | 324/73 R |
| 3,651,315 | 5/1972 | Collins | 324/73 AT X |
| 3,665,303 | 5/1972 | Richards et al. | 324/73 |
| 3,667,289 | 6/1972 | Back | 73/117.3 |
| 3,673,397 | 6/1972 | Schaefer | 371/25 |
| 3,689,838 | 9/1972 | Thurman, Jr. | 324/158 T |
| 3,702,989 | 11/1972 | Provenzano, Jr. et al. | 340/172.5 |
| 3,723,867 | 3/1973 | Canarutto | 324/73 PC |
| 3,737,767 | 6/1973 | Slutsky | 324/51 |
| 3,745,456 | 7/1973 | Kahler | 324/73 R |
| 3,753,094 | 8/1973 | Furuishi et al. | 324/29.5 |
| 3,764,995 | 10/1973 | Helf, Jr. et al. | 340/172.5 |
| 3,771,131 | 11/1973 | Ling | 364/200 |
| 3,783,378 | 1/1974 | Mildner | 324/73 R |
| 3,812,337 | 5/1974 | Crosley | 340/146.1 AB X |
| 3,825,733 | 7/1974 | White et al. | 340/151 X |
| 3,852,733 | 12/1974 | Sakurai | 340/251 |
| 3,854,125 | 12/1974 | Ehling et al. | 340/172.5 |
| 3,890,836 | 6/1973 | Mckenzie et al. | 73/168 |
| 3,920,973 | 11/1975 | Avellar et al. | 340/146.2 X |

Primary Examiner—Edward J. Wise
Attorney, Agent, or Firm—Peter Abolins; Clifford L. Sadler

[57] ABSTRACT

This specification discloses a vehicle electrical system tester which connects in parallel across the vehicle battery and the portion of the electrical system to be tested and measures voltage changes upon selective actuation of portions of the vehicle electrical system. Comparison of these measured voltages with predetermined values is used in evaluating whether the electrical system is operating properly. The method of testing using the apparatus includes measuring a first voltage level after connection of the apparatus, actuating a portion of the vehicle electrical system, measuring a second voltage level, calculating a voltage difference as a function of the first and second voltage levels, comparing the voltage difference to a predetermined voltage magnitude, and determining if the actuated portion of the electrical system is operating properly. Additional sensitivity can be achieved by establishing a third voltage level through the use of a calibration resistor.

10 Claims, 7 Drawing Figures

Left-side labels (pointing to printout):
- UNIMETS I.D. NUMBER
- TIME
- VEHICLE BATTERY VOLTAGE
- DEVICE NUMBER Printout contents:
```
UNIT 00 INSP 09
00.45 00/00/00
SERIAL NO 000001
BATTERY 12.742
NML MODE

COURTESY H/LP SW
VSL-DEF.
#013 REP CD:
REPAIRED BY:

PARKLAMPS
EL-OPEN; VSL-OK
#015 REP CD:
REPAIRED BY:

LF DOOR
VSL-DEF., EL OK
#063 REP CD: 12
REPAIRED BY JCB

ENG. & ALT. LIGHTS
VSL-DEF., EL OK
#068 REP CD:
REPAIRED BY:

REPAIR CODES
1-MISSING  1-BULB
2-WRONG    2-PART
3-SHORT'D  3-W/A
4-LOOSE    4-HOSE
5-INOP.    5 MOTOR
6 CROSS'D  G-CIRCT.
7 DISCON.  7-FREON
8-BLOWN    8-FUSE
9 VSL DEF  9-SW
01-OTHER
02-NO DEFECT
```

Right-side labels (pointing to printout):
- INSPECTOR I.D. NUMBER
- DATE
- VEHICLE SERIAL NUMBER
- NORMAL MODE TEST
- DEVICE DEFECTIVE
- FAILURE MODE (VISUALLY DEFECTIVE)
- SPACE FOR 2 DIGIT REPAIR CODE (FROM LIST)
- SPACE FOR REPAIRMAN'S STAMP
- ANOTHER DEFECTIVE ITEM
- REPAIR CODE - MISSING PART
- REPAIRMAN'S STAMP
- REPAIR CODES - WHICH REPAIRMAN USES TO DETERMINE HOW DEVICE FAILED -12 MISSING PART

FIG.6

LOCATED THROUGH OUT
PLANT AND IN QUALITY
CONTROL OFFICE

FIG. 7

APPARATUS AND METHOD FOR CALIBRATED TESTING OF A VEHICLE ELECTRICAL SYSTEM

BACKGROUND OF THE INVENTION (1) Field of the Invention

This invention relates to testing apparatus and, particularly, to an apparatus and method for testing vehicle components including the vehicle electrical system.

(2) Prior Art

A function of electrical testing equipment is to determine the existence and location of electrical system defects so that they can be corrected during manufacture and substantially reduce repair expenses. Among the known means of testing a motor vehicle manufacture is a relative elaborate system which provides an interface between moving vehicles and off line equipment including a computer, a card reader and a printer. Typically, such a system requires permanent modification of existing facility and is relatively expensive.

Another prior art attempt at monitoring an electrical system of a car is taught in U.S. Pat. No. 3,783,378 issued to Mildner. The patent teaches the use of a battery adaptor which adds resistance to the vehicle electrical system. The battery cable is disconnected and the battery current is routed through the tester measurement circuitry. It would be desirable to eliminate the need for a special battery adapter. Further, it would also be desirable to reduce the hookup time required by such a special battery adapter.

Although there are known means for testing various vehicle electrical system components there is still a need for a simple testing method which would reduce the amount of operator time required in comparison to any known prior art system. These are some of the problems this invention overcomes.

SUMMARY OF THE INVENTION

This invention recognizes that a portable vehicle electrical tester can be connected between the vehicle battery voltage and vehicle ground in parallel with the vehicle electrical system to be tested. The tester includes a voltage measuring means for measuring the voltage change due to actuation of a portion of the vehicle electrical system. Comparison means within the tester compare the voltage change detected by the voltage measuring means to a predetermined value to determine whether or not the actuated portion of the vehicle electrical system is functioning properly.

In accordance with an embodiment of this invention, the method of testing includes the steps of connecting a voltage measuring means in parallel across the vehicle battery, measuring a first voltage, actuating a portion of the vehicle electrical system, measuring a second voltage level, calculating a voltage difference as a function of the first and second voltage levels, comparing the voltage difference to a predetermined voltage magnitude and determining if the actuated portion of the electrical system is operating properly.

An apparatus in accordance with an embodiment of this invention is particularly advantageous to insure that the current draw and voltage measurement of all vehicle electrical systems are within specifications and that all required electrical optional equipment is present on the vehicle. In a preferred embodiment, the tester is a hand held device which contains a microcomputer, a printing head, a card reader and an analog digital voltage converter. The tester is powered through and makes its voltage measurements through the vehicle cigar lighter socket. It is the simplicity and portability which makes this tester particularly easy to use. Individual components are turned on and off by an operator, and the current drawn thereby is measured by detection of changes in battery voltage, taking the verify proper functioning of the vehicle air conditioning and heating system. The apparatus can include a display for directing the operator to proceed with specific test sequences. Additionally, an option data card supplied with the vehicle electrical system to be tested is used to indicate the absence or presence of individual components on the vehicle. The card can be read by the device and the appropriate test sequence initiated. When the card is unavailable, the operator can enter option data via a keyboard. Test results can be indicated to the operator by sounding a tone and by using the display. The operator can cause the system to retry a particular test. A message can be printed by the test set for adhesion to a record location found in the vehicle. A memory can be used to store the operating program and parameters. The memory and processing unit can be powered by internal batteries, while other power consuming equipment such as the printer and display can obtain power from the vehicle battery. The test set can further include a summary capability so that results pertaining to hourly or shift data, including defect rates are available.

A repair buy-off or repair completion mode can be available for performing an individual test after repair of a detected problem. In this made, the operator enters the number of the failed device via the keyboard and the tester displays the name of the device to be retested. The operator activates the device which is then tested by the tester. If both the tester and the operator "ok" the test, the operator is requested to enter a 2 digit code via the keyboard which was written on the original reject print out by the repairman to describe the cause of the failure. For example, the repair code 1,1 would indicate "missing bulb". This is repeated until all failed devices are retested at which time a print out is obtained from the tester listing all items retested and their status. The repair codes are summarized on the shift report during transmission of defect summaries to the data terminal.

DETAILED DESCRIPTION OF THE INVENTION

Figure 1:
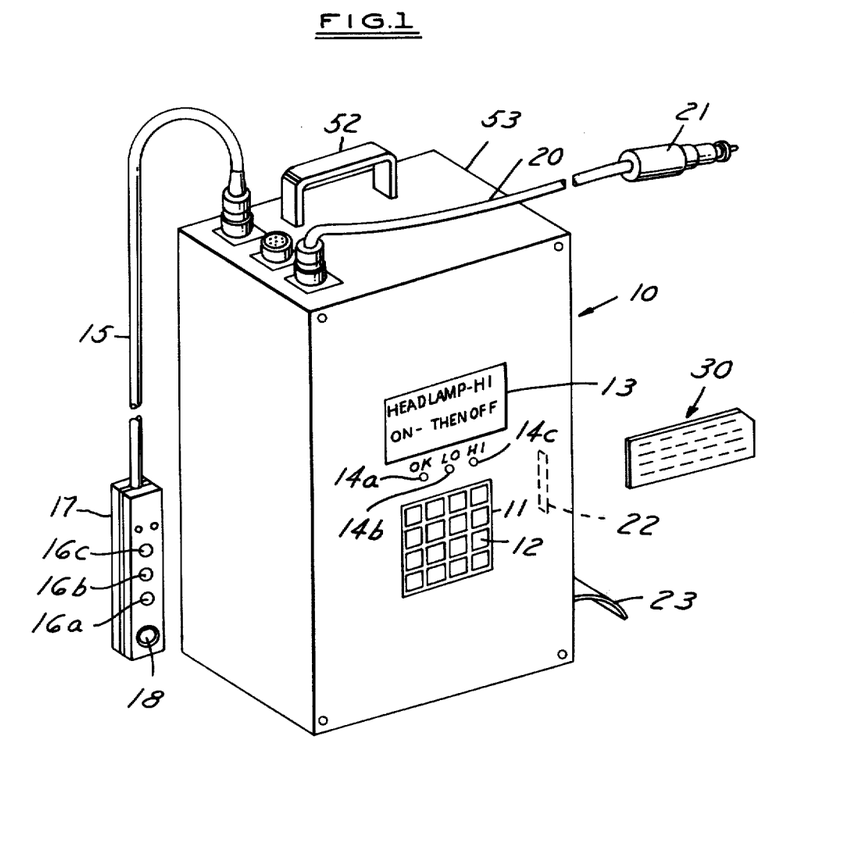
FIG. 1 is a front perspective view of a vehicle electrical system tester in accordance with an embodiment of this invention.
Figure 7:
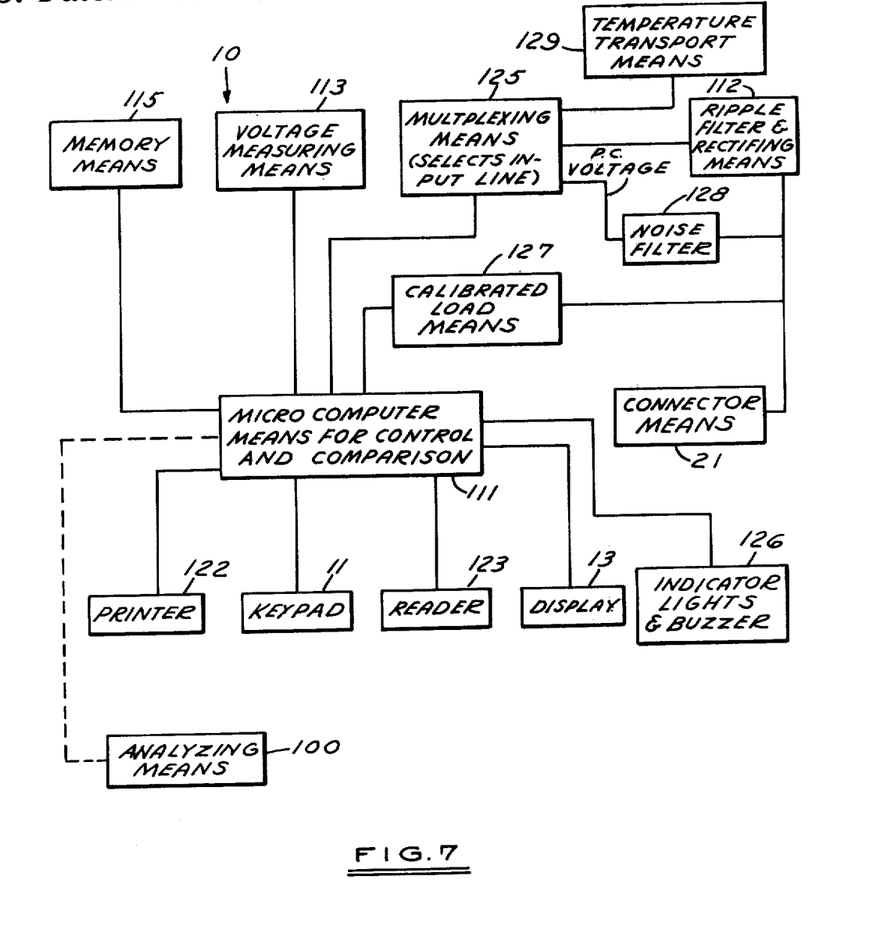
FIG. 7 is a block diagram of an electrical system tester in accordance with an embodiment of this invention.

Referring to FIG. 1, a vehicle electrical system tester 10 can be used for determining whether the electrical current draw of various vehicle electrical systems are within specifications and for providing a structured test sequence to be followed by quality control inspectors in an assembly plant. The test can be performed on a moving line or in test stalls with no physical connections between the vehicle and off-line equipment. Tester 10 is a hand held, stand alone, microcomputer controlled device which can be powered by, and makes voltage drop measurements through, a single connection to the vehicle battery at the cigar lighter socket or other appropriate location. The current being drawn by the device being tested can be calculated from the voltage drop and compared to limits in a memory 115 (FIG. 7). Results of the test, which can include defect rates, can be printed by tester 10.

Figure 6:
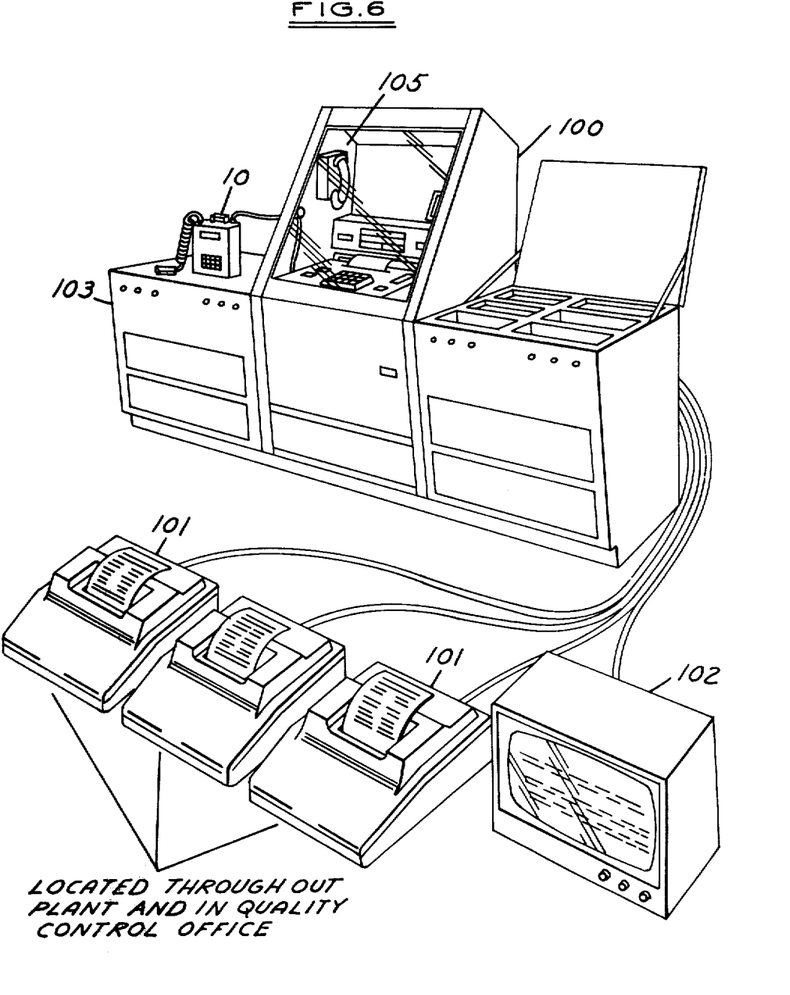
FIG. 6 is a frontal perspective view of the components of a testing system in accordance with an embodiment of this invention.

The electrical option content of the vehicle can be provided to tester 10 by manual insertion of a specially punched, standard 80 column computer card 30, by another form of electrical data input or by having the operator answering yes or no via the keyboard as the tester displays all possible vehicle electrical options. After such information is provided, tester 10 can provide prompting information to guide a quality control inspector through the required tests by sequentially displaying instructions on a light emitting diode, alpha numeric visual display 13. As the inspector activates the various vehicle electrical systems, the tester will automatically determine the current draw and compare it to acceptance limits stored in memory 115. Upon completion of the test sequence, the inspection results can be printed by tester 10 while it is still connected to the vehicle. In addition to the hand held testers 10, there can be an off-line programmable data terminal or analyzing means 100, such as shown in FIG. 6, used for storing data and printing defect summaries.

Vehicle electrical tester 10 is a generally rectangular box having a keyboard 11 on the front thereof having a plurality of buttons 12 indicating number entries for tester 10. Tester 10 includes a cable 20 having connected thereto a vehicle connector assembly 21 for connection to the vehicle at a point such as the cigar lighter socket. The front face of tester 10 includes three button lights 14a, 14b and 14c which indicate whether the result of the test is satisfactory (OK), the voltage recorded is below the acceptable limit (LO), or the voltage recorded is above the permissible limit (Hi), respectively. A cable 15 extends from tester 10 to a control handle 17 having control buttons 16a, 16b, 16c, for use by a test operator to enter the result of any test which has a visual result to be observed by the test operator. For example, button 16a indicates satisfactory test completion (OK), button 16b indicates rejection (REJ), and button 16c indicates a retry of a certain test (RTY). Control handle 17 also includes an air flow port 18 wherein there is contained a temperature sensing device 19 which changes electrical characteristics in response to the temperature of the air flow from a vehicle air conditioner. Tester 10 further includes a slot 22 for receiving computer card 30 containing option information and a printer for providing a printed output 23 of the electrical system test results for a given vehicle. A handle 52 is attached to a case 53 for carrying tester 10. Connector assembly 21 is electrically connected to handle 52 to provide a discharge path for both tester 10 and an operator holding handle 52.

The format of option data computer card 30 utilizes punched holes in a column and line matrix which can be read by a built-in card reader having a card guide, three or four photocells with light sources and the software to interpret the information. Each column represents a particular option and is punched either true on one line or false on another line. Since each column is punched, punches in other lines can be correlated with the appropriate columns as the operator manually inserts and then removes the card. The card reader can be designed so that the operator must fully insert the card and then fully remove the card with only one change in direction of motion, in order for the information from the card to be accepted.

In some applications it may be desirable to replace or supplement the card reading capability of tester 10 with a bar code reading capability. For example, tester 10 can have the capability of reading in the vehicle serial number and option content in the vehicle electrical system by means of a bar coded label. Tester 10 can then be used for reading and verifying that the proper vehicle components have been assembled.

Vehicle electrical system tester 10 operates by measuring battery voltage fluctuations to check vehicle electrical systems. Additionally, tester 10 can accept an input from the operator who has conducted a visual inspection and an electrical input from a transducer used to measure various physical properties. Advantageously, the voltage reading made by tester 10 are actually the average of a minimum of 32 discrete voltage measurements to eliminate the effects of noise. Tester 10 can perform the following seven different test types to evaluate the performance of a vehicle electrical system.

Figure 3:
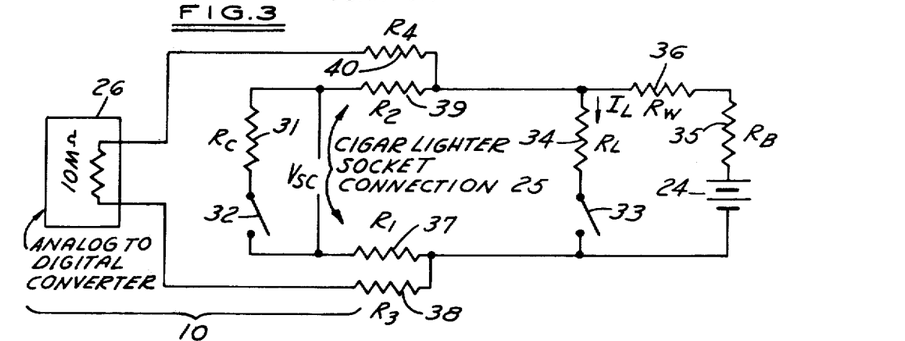
FIG. 3 is a simplified schematic diagram of the connection of a tester to a vehicle electrical system in accordance with an embodiment of this invention to a vehicle.

First, referring to FIG. 3, there is the measurement of an absolute voltage level and comparison of that level to a predetermined value. For example, in order to verify that a vehicle battery 24 is sufficiently charged, tester 10 measures the DC voltage at a cigar lighter socket 25 and adds a correction factor to compensate for voltage drop in the vehicle wiring, typically 0.2 volts.

Second, there is the measurement of a voltage change. For example, in a full load alternator test, to assure that the alternator has sufficient output, the engine is run at 2000 rpm with the headlamps and high blower turned on. Tester 10 then measures the voltage across the vehicle battery 24 and assures that the voltage increase is by at least 0.2 volts but not more than 3 volts over the voltage present prior to starting the engine. A no-load alternator test is similar to the full load test except that the headlamps and blower are turned off and the tester assures that the voltage is between 12 and 15.5 volts.

Third, there is a voltage change measurement in response to the resistance change of a transducer. For example, an air conditioning cooling test is done by holding temperature sensing device 19, such as a thermistor, in front of an air conditioner register. To verify that the air conditioning is cooling, tester 10 records a voltage level representing the initial temperature and continues to sample until a reading is obtained which is approximately 3° F. below the recorded reading. The concept of using resistor variation can be expanded to measure other physical properties of the vehicle by using different transducers. For example, transducers may measure vacuum, torque, paint thickness, color, lamp intensity, magnetic flux of spot welds, direct current, etc.

Fourth, a visual test by the inspector requires no automatic inputs by tester 10. The inspector visually inspects and then accepts or rejects the test being displayed prior to continuing on to the next test. Further, in a preferred mode of operation of tester 10, all of the tests performed by tester 10 require a verifying input from the operator prior to going on to the next test.

Figure 2:
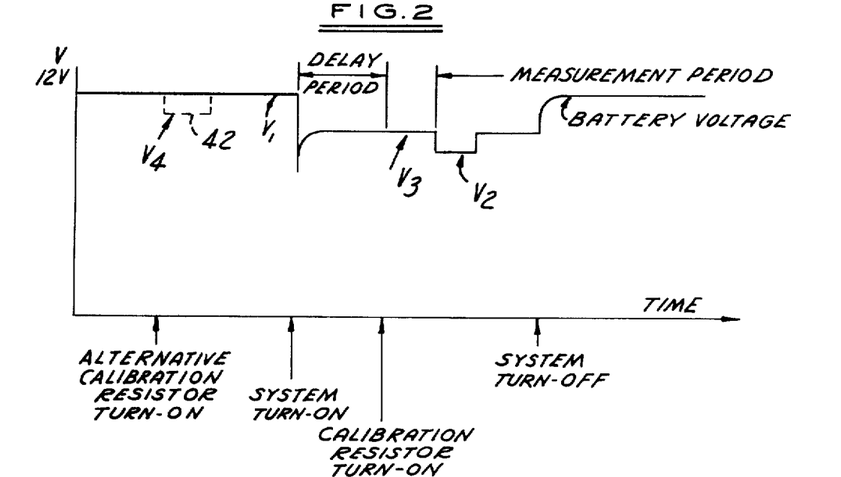
FIG. 2 is a graphical display of voltage versus time of a test of a portion of a vehicle electrical system in accordance with an embodiment of this invention.

Fifth, a calibrated current measurement test can be used on portions of a vehicle electrical system which are substantially resistive loads, such as lamps and heated backlights. Referring to FIG. 2, a typical sequence during a calibrated current measurement test includes displaying a message on visual display 13 such as "brake lamps, on and off" and taking voltage readings. When a portion of the vehicle electrical system is turned on, tester 10 senses the turn on via lower voltage readings. The voltage reading before system turn on is recorded. After delaying a programmable time period to allow turn on transients to settle out, a second voltage is recorded and a calibration resistor is momentarily turned on and the resulting voltage is recorded. The obtained voltage readings are used to calculate current drawn by the vehicle electrical system and verify that it is within limits. All the voltage readings are advantageously made by taking a programmable number of voltage readings and determining the average of the readings.

Sixth, a non-calibrated current measurement test is used to test systems such as motors and turn indicator signals where it is not practical to use the calibration resistor discussed above due to the large amount of electrical noise generated by these systems. Voltage readings are made before and after the actuation of a portion of the electrical system. The difference between these two voltage readings is then scaled to provide a measurement of current draw. Different scaling factors are used depending upon the size of the vehicle's battery. For example, this type of test includes measurement of the average current as a power window is fully lowered and then raised.

Seventh, a ripple test is used to verify that various vehicle warning buzzers are operating. Tester 10 performs this test by filtering out the DC voltage and all frequencies outside of a 50 to 700 Hz band, performing a full wave rectification of the ripple and by then measuring the average value of the resulting ripple. This test can also be used for motors.

In a typical application, it is advantageous to have the voltage measurements used to determine acceptable battery voltage and alternator charging voltages to be accurate to within plus and minus 1 percent. Further, all voltages can be measured to a resolution of ±2.5 millivolts with an absolute accuracy of ±12 millivolts using a 12 bit analog to digital converter with a resolution time of 150 microseconds. A typical test sequence is estimated to require from about 4¼ minutes to about 6 minutes per vehicle depending upon the option content of the vehicle. Each of the hand held testers 10 can be connected to analyzing means 100 approximately once per hour for transferring data and printing defect summaries.

Referring to FIGS. 2 and 3, the calculation of a current, I, which is indicative of the resistance of the portion of the electrical system to be tested is computed using the values of voltage measured during the calibrated current test as well as the magnitude of the various resistances in the circuit. Voltage $V_1$ is the level measured before actuation of the portion of the electrical system to be measured, level $V_2$ is the voltage level measured during the time calibration resistor 31 is connected by a switch 32 across vehicle battery 24. A voltage level $V_3$ is measured when switch 32 is opened and a switch 33, connecting a load resistor 34 across battery 24, is closed. A resistor 35 is the internal resistance of battery 24 and is typically approximately equal to about 0.012 ohms. A resistor 36 is the wiring resistance and is typically equal to about 0.01 ohms. Calibration resistor 31 is typically about 6 ohms. A resistor 38 and a resistor 40 are the cigar lighter socket contact resistances and each equals approximately 0.005 ohms. An analog to digital converter 26 has an input resistance of about 10 mega ohms. Resistance 39 and resistance 37 are also the cigar lighter contact resistances and have a similar value to resistances 38 and 40, that is 0.005 ohms. Resistances 37, 38, 39 and 40 are somewhat erratic due to the poor contact characteristics of the chrome plating of the interior of the cigar lighter socket. In solving the circuit shown in FIG. 3, load current $I_L$ is found to be equal to:

$$I_L = \frac{V_2(V_3-V_1)(1.63)}{R_c(V_2-V_1)(13.63-V_1)}$$

The terms "1.63" and "13.63" have been found to vary as a function of the characteristics of the power supply for the tester, e.g., the vehicle battery.

Referring to FIG. 2, a dotted outline 42 indicates that calibration resistor 31 can be turned on before switch 33 is closed and the portion of the electrical system to be tested is connected across vehicle battery 24. In this case, the level of the bottom portion of dotted outline 42 is denoted as $V_4$. The current $I_L$ through resistor 34 is found to be equal to:

$$V_1 - V_3/R_{36} + R_{35}$$

Voltage $V_1$ is equal to the vehicle battery voltage $E_b$ and voltage $V_3$ is known. In solving for resistors 35 and 36 using a typical single circuit cigar lighter socket connector, the converter 26 measures the voltage $V_{sc}$ as shown in FIG. 3. Therefore:

$$R_{36} + R_{35} = \frac{(V_1-V_4)(R_{31}+R_{37}+R_{39})}{V_4} - (R_{37}+R_{39})$$

Since the term $R_{37}+R_{39}$ can be up to 0.01 ohms, approximately a 50% error may occur. In solving for $R_{36}+R_{35}$ using the proposed dual circuit cigar lighter socket connector, the following results:

$$R_{35} + R_{36} = \frac{(V_1-V_4)(R_{31}+R_{37}+R_{39})}{V_4}$$

The error involved is $$(R_{37}+R_{39})/R_{31}$$

which is approximately 0.01 divided by 6 or 0.2%. This is relatively insignificant.

A vehicle battery is not necessarily 12 volts and the actual current may vary from the current associated with a standard 12 volts. To get the current at a standard 12 volts we multiply the actual current by the ratio 12 divided by $V_1$. Further, the above mentioned 1.63 factor has been derived to be typically of automobile electrical systems which has been tested.

The following is a listing of items which can be inspected by an operator and whether they use a visual check, an electrical check or a combination of both visual and electrical checks.

TABLE I

| COMPONENTS INSPECTED | Visual Check Only | Visual & Electrical Check | Electrical Check Only |
|---|---|---|---|
| Illuminated Entry | x | x | |
| Electrical Door Lock | | x | |
| Park Lamp | | x | |
| Cluster Lights | | x | |
| Floor PRNDL Light (Transmission Indicator Light) | | x | |
| Radio Light | x | | |
| Ash Tray Light | x | | |
| Clock Function and Light | x | | |
| Headlamp Key Warning | x | x | |
| Headlamps Low Beam | | x | |
| Head Lamps High Beam | | x | |
| Power Seats | | x | |
| Brake Lamp | | x | |
| Horn Standard | | x | |
| Horn Deluxe | | x | |
| Harzard Flashers | | x | |
| Cigar Lighter | | x | |
| Console Light | | x | |
| Dome/Map Lights | | x | |
| Visor Lights | | x | |
| Glove Box Light | | x | |
| Seat Belt Buzzer and Light | | x | |
| Engine Alternator Light Gages | x | | |
| Park Brake Warning Light | x | | |
| Turn Signals | | x | |
| Cornering Lights | | x | |
| Wiper Washer | | x | |
| Door Jam Switches | | x | |
| Door Ajar Lights | x | | |
| Key Warning Buzzer | | x | |
| Automatic Seat Belt Release | | x | |
| Power Windows | | x | |
| Back-up Lights | | x | |
| Rear Wiper Washer | | x | |
| Radio Speakers | x | | |
| CB Microphone Plug | x | | |
| Deck Release | | x | |
| Heated Back Light | | | x |
| Rear Defogger | | x | |
| Air Conditioner Heater Blower | | x | |
| Air Conditioner Cooling | | x | |
| Brake Warning Light | x | | |
| Starter | | x | |
| Climate Control Modes | x | | |
| Full Load Alternator | | | x |
| No Load Alternator | | | x |
| Battery | | | x |
| Radio Antenna | | x | |

Tester 10 is connected to the vehicle electrical system by means of a vehicle connector 21, which is the subject matter of a copending application entitled "Connector Plug for Vehicle Electrical Tester", with the same inventor and assignee as this application, the disclosures of which being incorporated by reference herein. A special connector assembly 21 having a dual connection is required because, to obtain accurate voltage measurement of the vehicle electrical system through a cigar lighter socket, the voltage drop at the connection contact points must be very small. Typically, the materials used in present day cigar lighter sockets do not provide for very low contact resistance. Therefore, it is particularly advantageous to use a dual circuit cigar lighter connector. One circuit is used for connecting sensitive measurement data and the other circuit is used for supplying power to tester 10. The principle of using dual circuits also applies to measurements taken at any point in the vehicle electrical system where battery voltage and ground are available. For example, this includes the battery terminal, fuse block, lamp, sockets, diagnostic vehicle electrical connectors and on-board vehicle microcomputers. If a vehicle does not have a cigar lighter socket, tester 10 can be connected to the wire which would normally power the cigar lighter.

Referring to FIG. 7, a microcomputer 111 includes a comparison means for comparing voltages and is connected to a memory means 115 and to a filter and rectifying means 112 through a voltage measuring means 113, and a multiplexing means 125 which selects an input line to be used. Voltage level measured by voltage measuring means 113 are compared in the comparison means of microcomputer means 111 to predetermined values received from memory means 115. As further discussed later, the predetermined levels and memory means 115 can be altered by microcomputer 111. Microcomputer 111 also controls a coupled display 13 thereby providing prompting information to the operator. Key pad 11 is also connected to microcomputer 111 and provides a manual information input into microcomputer 111 which can then be stored, if desired, in memory means 115. A printer 122 is also connected to microcomputer 111 and is actuated by microcomputer 111 and prints out information supplied to printer 122 by microcomputer 111. Microcomputer means 111 is also connected to a reader 123 such as a card reader, and indicator means 126, such as lights and buzzers, and an analyzing means 100. Connector means 21 is coupled to microcomputer means through a calibrated load means 127 and to multiplexing means 125 both through a noise filter 128 and filter and rectifying means 112. A temperature transponder means 129 is connected to multiplexing means 125.

The software of tester 10 is designed to maintain a running means and standard deviation for each of the various tests, such as those described above, performed on the vehicle. Acceptance upper and lower limits are implemented by setting two parameters which establish within tester 10 the number of allowable standard deviations from the mean. Thus, tester 10 includes an automatic limit concept.

Current limits are statistically developed and used by tester 10 unless over-riden by manual input of limits. Tester 10 develops a current draw average and standard deviation for each test and is to accept or reject based on limits determined by average current plus "X" standard deviations and average current minus "Y" standard deviations. "X" and "Y" are to be programmable parameters and are typically equal to about three. In order for a new current value to be used in developing limits during normal operation, the device which is drawing the current must be within previously developed limits. The current average can be developed by programming the following equation:

$$IA(L) = IA(L) + I - IA/N(L)$$

where

IA(L) IS the current average for test "L"
I is latest current measurement
N(L) is number of samples in current average.

The standard deviation can be developed using the following equation:

$$\sigma(L) = \sqrt{\sigma(L)^2 + \frac{[I - IA(L)]^2 - [\sigma(L)]^2}{N(L)}}$$

where (L) is the standard deviation for test "L". During development of limits for a device, the first ten current readings which are greater than zero and which are visually accepted are used for limit development. After this, the limits are operational and N(L) is allowed to increase to approximately 1,000. N(L) is then held constant as new current readings are continuously entered into the above equations. This will allow the testers limits to be slowly corrected to the actual current averages and standard deviations. For example, if the actual current average suddenly shifts one percent due to changes in the manufacturing techniques of a device, the testers's average will change approximately 0.7 percent during the first week and an additional 0.2 percent during the second week.

If a large acceptable change occurs in the actual current and standard deviation, N(L) is to be set to zero and new limits developed. Should it be found desirable to have fixed limits for any tests, provisions are provided by which the tester's limits can be printed out and used for reference while programming fixed limits.

Referring to FIG. 6, an analyzing means 100 includes a printer output 101, a cathode ray tube output 102, and a charging unit 103. Portable tester 10 can be coupled to charging unit 103 to recharge internal batteries. Additionally, portable tester 10 can be coupled to analyzer 100 to both receive and transmit data. That is, instructions stored in analyzer 100 can be transmitted to tester 10 to govern the operation of tester 10. Data stored in tester 10 during operation, can be transmitted back to analyzer 100 for analysis and print-out. Analyzer 100 further includes a remote input 105, such as a telephone modem, for receiving instructions to be transmitted to tester 10 so that the instructions in analyzer 100 can be changed from a remote location.

Typical components are a Texas Instrument TI-742 for the data terminal, a Texas Instrument Model 810 for the remote printer, and a modem manufactured by Vadic Corporation, such as the VA-1240K, for communication among the TI-742, the remote printers, the visual displays and the VA-1205-D auto answer. Such a connection provides for communication between a central and a remote location to permit updating of program tapes. The central processor, the above mentioned TI-742 includes a display screen for providing prompting for the operator. For example, the first display typically requires the operator to establish a set of initial conditions so that there can be a segregation between previous data and new data.

OPERATION

The basic test sequence using tester 10 includes connecting tester 10 to the cigar lighter socket by means of vehicle connector assembly 21. Option data computer card 30, containing information about the vehicle electrical system, is inserted into an internal reader 123 of tester 10. The operation of inserting and removing computer card 30 reads the material into tester 10 and stores it therein. Once computer card 30 is removed from tester 10 it can again be attached to the vehicle. If desired, for reasons such as unavailability of option data computer card 30, the operator can manually enter the option and model information by use of key pad 12 in response to true and false queries presented by tester 10 at visual display 13.

After the option information has been entered into tester 10, visual display 13 displays the first electrical device to be tested by the operator and prompts the operator to take the action required to test the device, for example, turn on the dome lamp. When a significant voltage change is transmitted to tester 10 through cable 20, tester 10 waits a predetermined time period and then takes a series of readings over a predetermined time period to find the average voltage change. Tester 10 then switches in (using a switch 32) a calibrated resistor 31 (FIG. 3) and measures the resulting voltage drop in order to calculate the internal resistance of battery 24 and wiring system shown in FIG. 3. Using the values found when the calibration resistor is switched in, the current draws are calculated and compared to those limits for the test being performed. Tester 10 displays the appropriate words "pass", "low", or "high" and, if desired, produces an audio tone which is different for each of the different messages.

After tester 10 has evaluated the test to be performed, the operator turns off the electrical device being tested and pushes either the "visually OK", "visually reject" or "retry" button. If the "retry" button is pushed, the step of inserting calibrated resistor 31 and performing the task on the portion of the electrical system being tested is repeated. If the "visually ok" or "reject" button is pushed, the tester records the results and displays the next test to be performed. Under normal test, the operator will proceed through the testing sequence by turning the device on, listening to the buzzer which indicate the test results, turn the device off and enter his visual inspection results.

After the operator has sequenced through all of the tests to be performed, such as those listed in Table I above, an "end test" message will be displayed by the tester. If all the items tested were visually and electrically accepted, the tester will print the vehicle serial number and print a message such as "all electrical items are ok". If failures have been encountered, the tester will print the serial number and a message such as "brake lights low, dome light open." The operator tears off the message which has exited from printer 23 of the tester 10. Typically, the message is attached to the vehicle for further action. The operator can then disconnect and remove tester 10 from the vehicle. During some tests it may be advantageous for the inspector to leave the interior of the vehicle to do a visual examination. For example, a walk around visual check of the vehicle exterior illumination such as, for example, cornering lamps, flasher bulbs, hood light, deck light, and all side marker and park lamp bulbs can be visually verified as functional or not.

Reprogramming of tester 10 can be accomplished by several methods. For example, a magnetic tape cassette of the program changes can be made at a central location and mailed to the production facility where the vehicle electrical systems are being tested. A data terminal can then be used to transmit the program changes to the tester when the tester is connected to the data terminal. Alternatively, program changes can be typed into the data terminal directly, recorded on a magnetic tape and entered into the tester.

In a situation where there is no computer card 30 and the operator is inserting the information itself, tester 10 supplies prompting information. For example, tester 10 will display information about the vehicle electrical systems and the operator must note the information displayed and verify its accuracy. If the displayed information is not correct, the inspector can press button 16b or 16c and manually enter the correct information.

After this initial entry of this information, a typical signal displayed by tester 10 will read "turn off all electrical items". This is a reminder to the inspector to turn off any electrical devices which may have been previously left on in order to proceed with the next test. The inspector can sequence the next instruction from tester 10 by pressing button 16a indicating a "visual ok".

Figure 4:
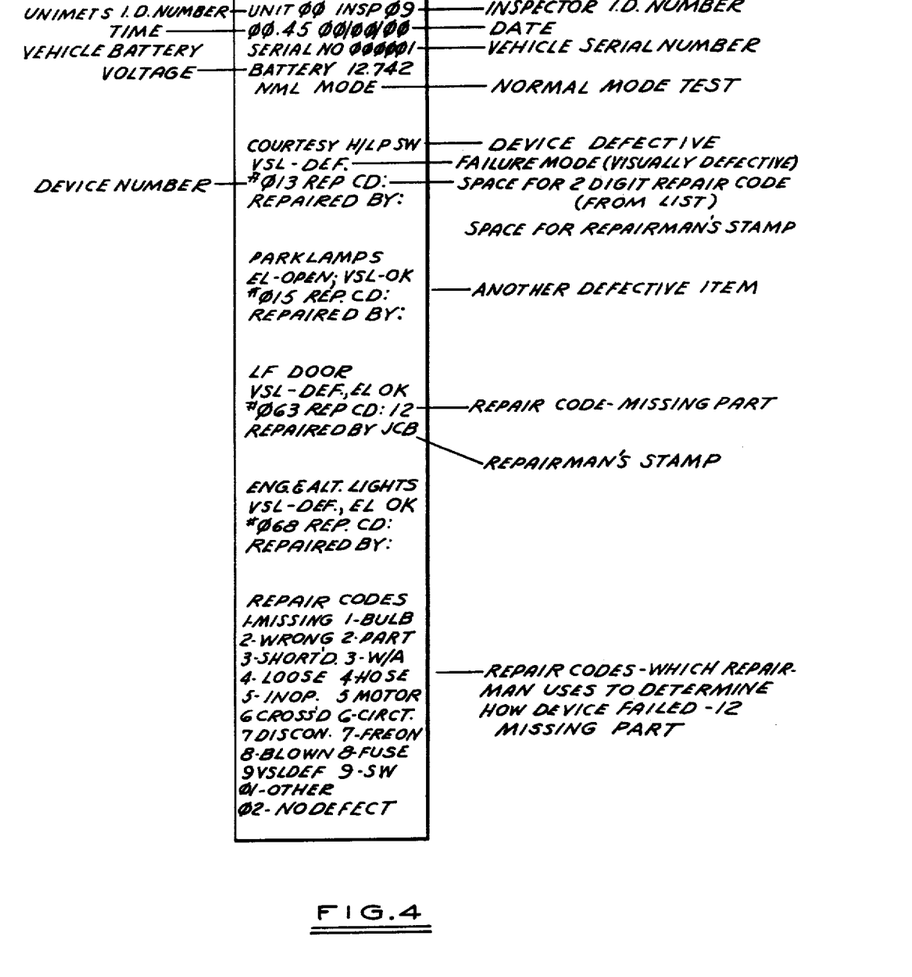
FIG. 4 is the printed output of the tester describing a situation wherein a portion of the vehicle electrical system has failed and operation of the vehicle was controlled by an automatic input card.

The general format of the display at visual display 13 can be that the top line is the name of the device to be tested and the bottom line will contain a general instruction on how to activate the device. In some cases, the inspector may wish to have tester 10 reexamine the device which has failed or passed. To accomplish this, button 16c for retry can be actuated. A typical printed output format for tester 10 is shown in FIG. 4.

Periodically, for example approximately every hour, the operator connects tester 10 to a line data terminal or analyzing means 100 and detect data is automatically transmitted to the analyzing means. Analyzing means 100, will automatically print out the defects summary for the last hour when all of the testers (e.g., 5 or 6) in use have transmitted their defect tables. At the end of another period of time, such as the end of a shift, the operators can connect each of the testers to the off line data terminal, one at a time for transmission of the defect tables. The data terminal will print out the defects summary for the entire shift. At the same time, the data terminal can record the defect summary on a magnetic tape cassette for permanent record.

Figure 5:
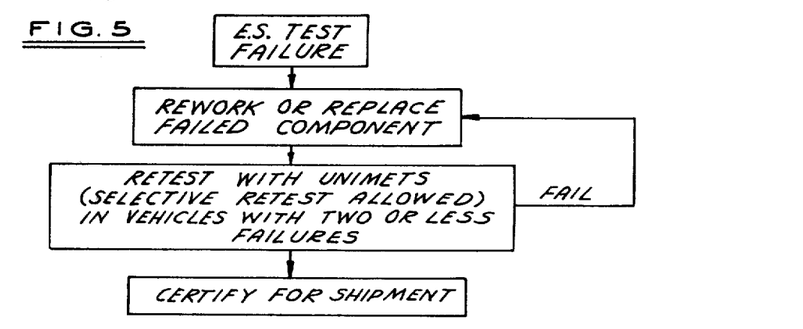
FIG. 5 is a flow diagram of a typical test sequence.

Vehicle electrical systems which have been previously rejected by tester 10 and have been repaired can be retested. FIG. 5 shows a block diagram of a typical sequence for correcting a fault. The inspector connects tester 10 to the cigar lighter socket and sequences tester 10 to the test to be performed. This causes the name of the test to be displayed on visual display 13 and select the acceptable limits for the test to be performed. The inspector performs the specified test and observes the display for the results. If the test system results are electrically and visually satisfactory, the inspector will push the "visually ok" button 16a. The tester will then send out a message such as "headlamps passed retest" will be printed out. This procedure is repeated until all repairs are retested. The inspector then tears off the written message from tester 10 and attaches it to the vehicle electrical system.

In addition to the above described selective retest operation, wherein the inspector checks a small number of items by entering in their device code and executing a test on that device, a complete retest can be done. Typically a complete retest would not be used where only one or two defects were found. A complete retest is similar to a normal test in that when the complete retest operation is finished visual display 13 displays end of test and printer 23 issues a report on the test.

Various modifications and variations will no doubt occur to those skilled in the various art to which this invention pertains. For example, the particular physical configuration of the tester may be varied from that described herein. These and all other variations which basically rely on the teachings through this disclosure has advanced the art are properly considered within the scope of this invention.

What is claimed is:

1. A method of testing a vehicle electrical system including the steps of:
   connecting a voltage measuring means in parallel across the vehicle battery and the vehicle electrical system;
   measuring a first voltage level across the vehicle battery and the vehicle electrical system;
   actuating a portion of the vehicle electrical system;
   measuring a second voltage level;
   calculating a voltage difference as a function of the first and second voltage levels;
   comparisng the voltage difference to a predetermined voltage magnitude; and
   determining if the actuated portion of the electrical system is operating properly by observing if the voltage difference is substantially the same as the predetermined voltage magnitude, which would indicate acceptable or proper operation, or if the voltage difference is substantially different from the predetermined voltage magnitude, which would indicate a malfunction or improper operation.

2. A method of testing as recited in claim 1 wherein the step of measuring the second voltage level includes the step of waiting a predetermined amount of time after turning on a portion of the vehicle electrical system to substantially reduce transients.

3. A method of testing as recited in claim 1 further comprising the steps of:
   inserting a calibration resistor across the vehicle battery; and
   measuring a calibration voltage.

4. A method of testing as recited in claim 3 wherein said inserting a calibration resistor is done before actuation of a portion of the vehicle electrical system.

5. A method of testing as recited in claim 3 wherein said inserting a calibration resistor is done after actuation of a portion of the vehicle electrical system.

6. A method of testing as recited in claim 5 further comprising the step of calculating a current in accordance with the formula:

$$I = \frac{V_2(V_3 - V_1)(K)}{R_c(V_2 - V_1)(R_2 + K - V_1)}$$

wherein
$V_2$ is the measured calibrated voltage,
$V_1$ is the voltage measured before actuation of a portion of the vehicle electrical system,
$V_3$ is the voltage measured after actuation of a portion of the vehicle electrical system,
$R_2$ is the magnitude of the calibration resistance, and
$K$ is a constant taking into account the characteristics of the vehicle battery and the first and second voltage levels.

7. A method of testing as recited in claim 5 wherein the step of actuating a portion of the vehicle electrical system is done in a predetermined sequence of portions of the vehicle electrical system.

8. A method of testing as recited in claim 7 further comprising:
   changing the magnitude of the predetermined voltage used for comparison for particular portions of the vehicle electrical system as a function of previously measured voltage levels associated with particular portions of the vehicle electrical system.

9. A method of testing the air conditioning system on an automobile including the steps of activating the air conditioning system;
   positioning a temperature responsive resistive element in front of the air flow from the air conditioner;
   detecting a change in voltage drop across the resistive element;
   comparing the change in voltage drop to a predetermined voltage magnitude; and
   determining if the air conditioning system is providing cooling air by observing if the change in voltage drop is substantially the same as the predetermined voltage magnitude, which would indicate acceptable or proper operation, or if the change in voltage drop is substantially different from the predetermined voltage magnitude, which would indicate a malfunction or improper operation.

10. A method of testing portions of a vehicle including:
    coupling a transducer to a vehicle component whose characteristic is to be measured;
    producing a voltage by the transducer as a function of the vehicle component characteristic;
    comparing the transducer voltage to a predetermined voltage magnitude;
    determining if the vehicle component characteristic is within limits;
    storing the option content of a vehicle to be tested in the comparison means;
    indicating to an operator of the test whether or not to conduct an examination of the vehicle; and
    changing the magnitude of the predetermined voltage magnitude used for comparison as a function of previously measured voltage levels associated with particular component characteristics of the vehicle.

* * * * *